（12） United States Patent
Oh et al.

(10) Patent No.: US 10,991,647 B2
(45) Date of Patent: Apr. 27, 2021

(54) PRINTED CIRCUIT BOARD AND PACKAGE STRUCTURE HAVING THE SAME

(71) Applicant: Samsung Electro-Mechanics Co., Ltd., Suwon-si (KR)

(72) Inventors: Yoong Oh, Suwon-si (KR); Sang-Hoon Kim, Suwon-si (KR); Hea-Sung Kim, Suwon-si (KR); Gyu-Mook Kim, Suwon-si (KR); Young-Kuk Ko, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/658,288

(22) Filed: Oct. 21, 2019

(65) Prior Publication Data

US 2020/0152566 A1    May 14, 2020

(30) Foreign Application Priority Data

Nov. 13, 2018    (KR) .................. 10-2018-0139039

(51) Int. Cl.
*H01L 23/498*    (2006.01)
*H01L 25/00*    (2006.01)
*H01L 21/48*    (2006.01)

(52) U.S. Cl.
CPC ...... *H01L 23/49838* (2013.01); *H01L 21/481* (2013.01); *H01L 21/4853* (2013.01); *H01L 23/49811* (2013.01); *H01L 23/49822* (2013.01); *H01L 25/00* (2013.01)

(58) Field of Classification Search
CPC ......... H01L 23/49838; H01L 23/49811; H01L 1121/481; H01L 1125/00; H01L 23/49822; H01L 21/4853; H01L 25/00
USPC ....................................................... 257/737
See application file for complete search history.

(56) References Cited

U.S. PATENT DOCUMENTS

2017/0207196 A1* 7/2017 Lee .................. H01L 23/49838

FOREIGN PATENT DOCUMENTS

| JP | 2017-034109 A | | 2/2017 |
|---|---|---|---|
| JP | 2017034109 A | * | 2/2017 |
| KR | 10-2012-0137173 A | | 12/2012 |
| KR | 10-2014-0075357 A | | 6/2014 |
| KR | 10-1497689 B1 | | 3/2015 |

* cited by examiner

*Primary Examiner* — Tong-Ho Kim
(74) *Attorney, Agent, or Firm* — NSIP Law

(57) ABSTRACT

A printed circuit board including: an insulating material having a bump pad embedded in a first surface thereof; a first insulating layer stacked on the first surface of the insulating material and including an opening portion exposing the bump pad; a second insulating layer stacked on the first insulating layer and including a first cavity exposing the opening portion; and a bump disposed on the bump pad in the opening portion.

21 Claims, 6 Drawing Sheets

US 10,991,647 B2

PRINTED CIRCUIT BOARD AND PACKAGE STRUCTURE HAVING THE SAME

CROSS-REFERENCE TO RELATED APPLICATION

This application claims the benefit under 35 USC 119(a) of Korean Patent Application No. 10-2018-0139039, filed on Nov. 13, 2018, the entire disclosure of which is incorporated herein by reference for all purposes.

BACKGROUND

1. Technical Field

The following description relates to a printed circuit board and a package structure having the same.

2. Description of the Background

In a package-on-package (POP) structure in which two packages are stacked in a vertical direction, when a circuit of a lower package becomes fine, a pitch of solder balls connecting the two packages to each other is decreased, and a height of the solder balls is decreased. When the height of the solder balls is decreased, a thickness of an electronic element mounted on the lower package may not be increased to a predetermined thickness or more.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes: an insulating material having a bump pad embedded in a first surface thereof; a first insulating layer stacked on the first surface of the insulating material and including an opening portion exposing the bump pad; a second insulating layer stacked on the first insulating layer and including a first cavity exposing the opening portion; and a bump disposed on the bump pad in the opening portion.

In another general aspect, a package structure includes: an upper package and a lower package coupled to the upper package, wherein the lower package includes a printed circuit board on which an electronic element is mounted, the printed circuit board including: an insulating material having a bump pad embedded in a first surface thereof; a first insulating layer stacked on the first surface of the insulating material and including an opening portion exposing the bump pad; a second insulating layer stacked on the first insulating layer and including a first cavity exposing the opening portion; and a bump disposed in the opening portion on the bump pad, and the electronic element is positioned in the first cavity and bonded to the bump.

A thickness of the first insulating layer may be less than a thickness of the second insulating layer.

A height of the bump with respect to the first surface of the insulating material may be greater than a height of the opening portion with respect to the first surface of the insulating material.

A height of the bump with respect to the first surface of the insulating material may be less than a height of the opening portion with respect to the first surface of the insulating material.

The printed circuit board may include a plurality of bump pads and a plurality of opening portions corresponding to the bump pads, and the first cavity may expose the plurality of opening portions.

The printed circuit board may include: a first outer layer circuit disposed on the second insulating layer and protruding outwardly; and a first solder resist covering the first outer layer circuit, and the first solder resist may include a second cavity connected to the first cavity.

The printed circuit board may include: a second outer layer circuit disposed on a second surface of the insulating material opposite the first surface and protruding outwardly; and a second solder resist covering the second outer layer circuit.

The printed circuit board may include: an opening disposed in the first solder resist and exposing a portion of the first outer layer circuit; and a conductive member disposed in the opening.

The printed circuit board may include: a via pad embedded in the first surface of the insulating material; and a via penetrating through the first insulating layer and the second insulating layer and connected to the via pad.

The printed circuit board may include an inner via disposed in the insulating material and connected to the via pad, a transversal cross-sectional area of the via may be decreased toward the via pad, and a transversal cross-sectional area of the inner via may be decreased toward the via pad.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
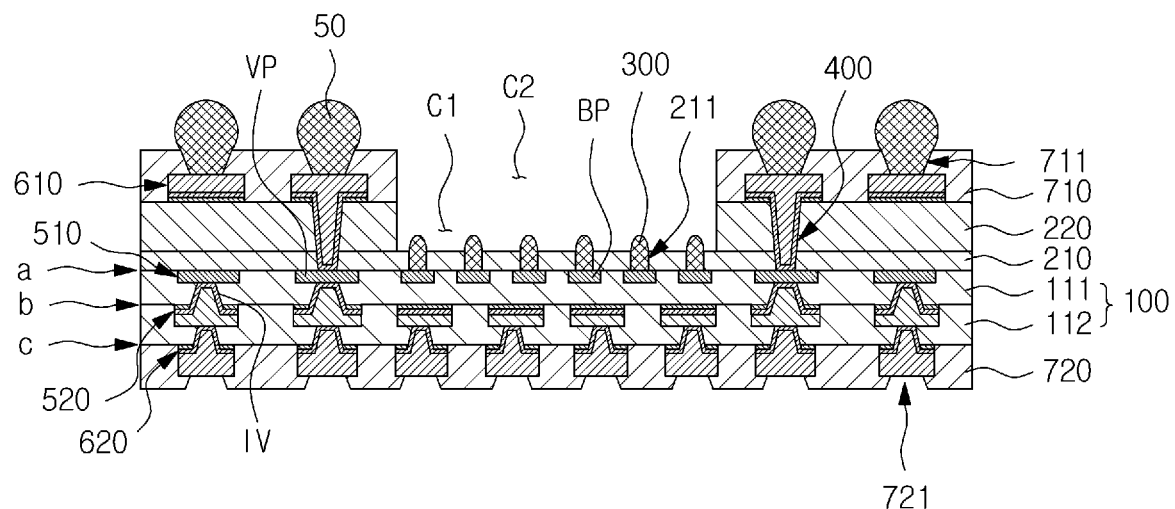
FIGS. 1 and 2 are views illustrating a printed circuit board according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
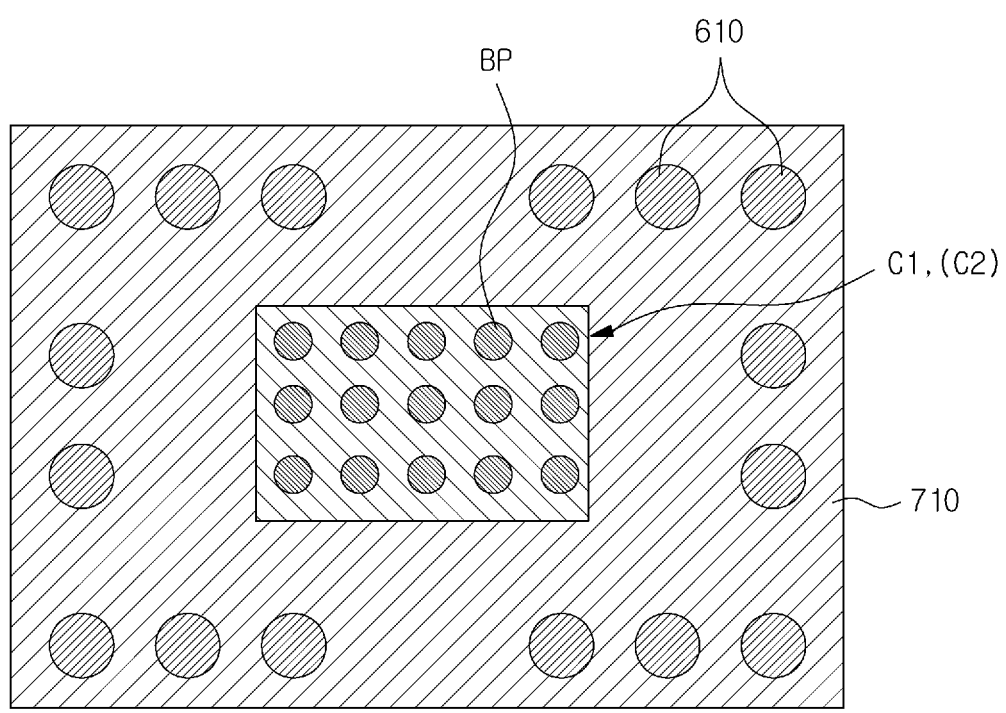

FIGS. 1 and 2 are views illustrating a printed circuit board according to an example.

Referring to FIG. 1, the printed circuit board includes an insulating material 100, a first insulating layer 210, a second insulating layer 220, and bumps 300.

The insulating material 100 is a planar structure formed of a non-conductive material. The insulating material 100 may be formed of a material including a resin, and the resin included in the insulating material 100 may be variously selected from a thermosetting resin, a thermoplastic resin, and the like. For example, the resin forming the insulating material 100 may be an epoxy resin, a polyimide (PI) resin, a bismaleimide triazine (BT) resin, a liquid crystal polymer (LCP), or the like, but is not limited thereto. A specific example of the insulating material 100 includes prepreg (PPG) and an Ajinomoto build-up film (ABF).

The insulating material 100 may include a fiber reinforcing material or a filler. The fiber reinforcing material may include a glass fiber. The glass fiber may be at least one of a glass filament, a glass fiber, and a glass fabric that are classified according to a thickness. The prepreg may have a structure in which an epoxy resin is impregnated in a glass fiber. The filler may be an inorganic filler or an organic filler. As the inorganic filler, one or more materials selected from the group consisting of silica ($SiO_2$), alumina ($Al_2O_3$), silicon carbide (SiC), barium sulfate ($BaSO_4$), talc, clay, mica powders, aluminum hydroxide ($AlOH_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$), and calcium zirconate ($CaZrO_3$) may be used.

The insulating material 100 may include an inner layer circuit therein. The inner layer circuit may provide a transfer path of an electrical signal, and may be formed of at least one of copper (Cu), silver (Ag), palladium (Pd), aluminum (Al), nickel (Ni), titanium (Ti), gold (Au), and platinum (Pt). In addition, inner vias IV connected to the inner layer circuit to provide an interlayer connection path may be formed in the insulating material 100. The inner vias IV may be formed of at least one of copper (Cu), silver (Ag), palladium (Pd), aluminum (Al), nickel (Ni), titanium (Ti), gold (Au), and platinum (Pt), and may be formed of the same metal as that of the inner layer circuit.

The inner layer circuit may be implemented in a structure in which at least a portion thereof is embedded in one surface of the insulating material 100. As illustrated in FIG. 1, one surface "a" of the insulating material 100 may be an upper surface of the insulating material 100. The meaning that the inner layer circuit is 'embedded in one surface of the insulating material 100' is that at least a portion of a thickness of the inner layer circuit is positioned in the insulating material 100. For example, the inner layer circuit may be completely positioned in the insulating material, such that only an upper surface of the inner layer circuit 100 may be exposed to one surface of the insulating material 100, and the upper surface of the inner layer circuit may be coplanar with one surface of the insulating material 100.

The inner layer circuit may include a plurality of circuit lines, and at least some of the plurality of circuit lines may include pads disposed on end portions thereof. A width of the pad may be greater than that of the circuit line. The pads provided on the end portion of the circuit lines may be bump pads BP or via pads VP. The bump pads BP are pads connected to bumps, and the via pads VP are pads connected to vias 400. There may be a plurality of bump pads BP and a plurality of via pads VP.

As illustrated in FIG. 2, the via pads VP may be positioned more adjacent to edges of the insulating material 100 than the bump pads BP. That is, the bump pads BP may be positioned at a central portion of the insulating material 100.

The insulating material 100 may include a plurality of layers. The plurality of layers may be formed of the same material or different materials. In FIG. 1, for convenience of explanation, the insulating material 100 includes two layers, that is, a first layer 111 and a second layer 112. Here, the first layer 111 may refer to a layer positioned at an upper side of the insulating material 100, and the second layer 112 may refer to a layer positioned beneath the first layer 111. Here, one surface of the first layer 111 may be the same surface "a" as one surface of the insulating material 100 described above. However, the insulating material 100 may be formed of a structure having three or more layers (unlike FIG. 1), and the number of layers of the insulating material 100 is not limited.

The respective layers of the insulating material 100 may include inner layer circuits. An inner layer circuit embedded in one surface of the first layer 111 among the inner layer circuits may be a first inner layer circuit 510, and an inner layer circuit formed on the other surface of the first layer 111 and embedded in one surface "b" of the second layer 112 among the inner layer circuits may be a second inner layer circuit 520. Here, the other surface of the first layer 111 and one surface of the second layer 112 are the same surface "b". The first inner layer circuit 510 and the second inner layer circuit 520 may be electrically connected to each other through the inner vias IV. There may be a plurality of inner vias IV, and the plurality of inner vias IV may include inner vias connecting the second inner layer circuit 520 and the bump pads BP to each other and/or inner vias connecting the second inner layer circuit 520 and the via pads VP to each other.

The first inner layer circuit 510 and the second inner layer circuit 520 may be formed by different methods. For example, the first inner layer circuit 510 may be formed by a tenting method, and the second inner layer circuit 520 may be formed by a method such as a semi-additive process (SAP) or a modified semi-additive process (MSAP). In this case, the first inner layer circuit 510 may include a single metal layer, and the second inner layer circuit 520 may include a plurality of metal layers. Here, the plurality of metal layers may include a copper foil layer, an electroless copper plating layer, and an electrolytic copper plating layer.

The inner vias IV may be formed by the same method as a method of forming the second inner layer circuit 520 to include a plurality of metal layers including a copper foil layer, an electroless copper plating layer, and an electrolytic copper plating layer and have the same layer construction as that of the second inner layer circuit 520.

In a case in which the insulating material 100 is formed in a structure having N or more layers, for example, three or more layers, the insulating material 100 may include a first layer 111 to an N-th layer and include a first inner layer circuit 510 to an N-th inner layer circuit. Here, the first inner layer circuit 510 and the other inner layer circuits may be circuits formed by different methods. For example, the first inner layer circuit 510 may be formed by a tenting method, and the other inner layer circuits may be formed by a method such as an SAP or an MSAP.

The first insulating layer 210 is stacked on one surface (one surface "a" of the first layer 111) of the insulating material 100. The first insulating layer 210 may be formed of at least one selected from an epoxy resin, a PI resin, a BT resin, an LCP, and the like. Specifically, the first insulating layer 210 may include PPG or an ABF. The first insulating layer 210 may include the glass fiber, the filler or the like described above. The first insulating layer 210 may be formed of a material that is the same as or different from that of the insulating material 100.

The first insulating layer 210 includes opening portions 211, which expose the bump pads BP embedded in one surface of the insulating material 100. In this case, the first insulating layer 210 may cover the other portions of the first inner layer circuit except for the bump pads BP. Particularly, the first insulating layer 210 may cover the via pads VP. In addition, in a case where the number of bump pads BP is plural, the number of opening portions 211 may be plural so as to correspond to that the number of bump pads BP. The opening portions 211 may be formed by a laser drilling process or a photolithography process. In a case where the opening portions 211 are formed by the photolithography process, the first insulating layer 210 may include a photosensitive resin.

The second insulating layer 220 is formed on the first insulating layer 210. The second insulating layer 220 is positioned on an opposite side to the insulating material 100 in relation to the first insulating layer 210. The second insulating layer 220 may be formed of at least one selected from an epoxy resin, a PI resin, a BT resin, an LCP, and the like. Specifically, the second insulating layer 220 may include PPG or an ABF. The second insulating layer 220 may include the glass fiber, the filler or the like described above. The second insulating layer 220 may be formed of a material that is the same as or different from that of the first insulating layer 210. In addition, the second insulating layer 220 may be formed of a material that is the same as or different from that of the insulating material 100.

The second insulating layer 220 includes a first cavity C1, which exposes the opening portions 211. Therefore, the bump pads BP are also exposed by the first cavity C1. In a case in which the number of bump pads BP is plural and the number of opening portions 211 is also plural so as to correspond to that the number of bump pads BP, the first cavity C1 may expose the plurality of opening portions 211 at a time. For example, as illustrated in FIG. 2, in a case where the plurality of bump pads BP is formed at the central portion of the insulating material 100 and the opening portions 211 are also formed at the central portion of the insulating material 100, the first cavity C1 is correspondingly formed at the central portion, such that the plurality of opening portions 211 (and the plurality of bump pads BP) may be exposed by the first cavity C1.

An inner side surface of the first cavity C1 may be a surface having an angle of 90° or more with respect to one surface of the insulating material 100. In a case in which the inner side surface of the first cavity C1 is perpendicular to (90° or more with respect to) one surface of the insulating material 100, the first cavity C1 may have a cylindrical shape of which a transversal cross-sectional area is constant in a vertical direction. In a case in which the inner side surface of the first cavity C1 is formed at an angle greater than 90° with respect to one surface of the insulating material 100, the first cavity C1 may have a cylindrical shape of which a transversal cross-sectional area is constantly decreased toward the insulating material 100. Here, in a longitudinal cross section of the first cavity C1, the inner side surface of the first cavity C1 appears in a linear shape (hereinafter, referred to as a 'cross-sectional line of the first cavity C1'). The cross-sectional line of the first cavity C1 may be a perpendicular straight line or a straight line inclined downwardly.

The inner side surface of the first cavity C1 may include a concave curved surface, which refers to a curved surface depressed inwardly of the first insulating layer 210. In this case, the cross-sectional line of the first cavity C1 may include a downwardly convex curved line.

A thickness of the first insulating layer 210 may be smaller than a thickness of the second insulating layer 220.

The bumps 300 may be formed on the bump pads BP in the opening portions 211 of the first insulating layer 210, and may be formed of a conductive material such as a metal. The bumps 300 may be formed by applying a metal paste into the opening portions 211 or may be formed by applying a metal paste into the opening portions 211 and curing the metal paste by a reflow process. The bumps 300 may be formed of a metal plating layer such as a copper plating layer.

As illustrated in FIG. 1, a height of each bump 300 may be greater than a height of the respective opening portion 211 of the first insulating layer 210. In this case, the bump 300 may protrude upwardly of the opening portion 211. An upper surface of the bump 300 may have an upwardly convex curved surface. The thickness of the second insulating layer 220 is greater than that the thickness of the first insulating layer 210, such that the bump 300 protruding upwardly of the opening portion 211 may be positioned in the first cavity C1.

A first outer layer circuit 610 may be formed on the second insulating layer 220, and a second outer layer circuit 620 may be formed on the other surface (the other surface "c" of the second layer 112) of the insulating material 100. The first outer layer circuit 610 may protrude outwardly (upwardly) from an upper surface of the second insulating layer 220, and the second outer layer circuit 620 may protrude from the other surface (the other surface of the second layer 112) of the insulating material 100 in an opposite direction (a downward direction) to a protruding direction of the first outer layer circuit 610. That is, the first outer layer circuit 610 and the second outer layer circuit 620 may protrude in opposite directions to each other.

The first outer layer circuit 610 and the second outer layer circuit 620 may be formed of the same material. Each of the first outer layer circuit 610 and the second outer layer circuit 620 may be formed of at least one of copper (Cu), silver (Ag), palladium (Pd), aluminum (Al), nickel (Ni), titanium (Ti), gold (Au), and platinum (Pt). The outer layer circuits (the first outer layer circuit 610 and the second outer layer circuit 620) may be positioned outside the inner layer circuits (the first inner layer circuit 510 and the second inner layer circuit 520, and may be the outermost circuits in the printed circuit board.

The first outer layer circuit 610 and the second outer layer circuit 620 may be formed by the same method as the method of forming the second inner layer circuit 520. That is, each of the first outer layer circuit 610 and the second outer layer circuit 620 may be formed by a method such as an SAP or an MSAP, and may include a plurality of metal layers including a copper foil layer, an electroless copper plating layer, and an electrolytic copper plating layer.

The printed circuit board may further include the vias 400, a solder resist, and the like.

The vias 400 may penetrate through both of the first insulating layer 210 and the second insulating layer 220 and electrically connect the first outer layer circuit 610 and the first inner layer circuit 510 to each other. Particularly, the vias 400 may be connected to the via pads VP. Since the vias 400 penetrate through both of the first insulating layer 210 and the second insulating layer 220, the vias 400 do not have separate lands on a boundary between the first insulating layer 210 and the second insulating layer 220. As illustrated in FIG. 2, in a case in which the via pads VP are positioned more adjacent to edges of the printed circuit board than the bump pads BP, the vias 400 may be positioned more adjacent to edges of the printed circuit board than the first cavity C1, and may be arranged along a circumference of the first cavity C1 in the vicinity of the first cavity C1. Here, the number of vias 400 may be plural.

A transversal cross-sectional area of the via 400 may be decreased toward the via pad VP. In this case, as illustrated in FIG. 1, a longitudinal cross section of the via 400 may have a reverse trapezoidal shape.

As described above, at least some of the inner vias IV may be connected to the via pads VP. A transversal cross-sectional area of each of the inner vias IV connected to the via pads VP may be decreased toward the via pads VP, and in FIG. 1, a longitudinal cross section of each of the inner vias IV may have a trapezoidal shape. That is, the vias 400 and the inner vias IV may have shapes symmetrical to each other in relation to the via pads VP. However, even in this case, heights (thicknesses) of the via 400 and the inner via IV may be different from each other, and a height (a thickness) of the via 400 may be greater than a height of the inner via IV.

Some of the plurality of inner vias IV may not be connected to the via pads VP, and a transversal cross-sectional area of the inner vias IV that are not connected to the via pads VP may also be decreased toward one surface of the insulating material 100. In addition, the second outer layer circuit 620 and the second inner layer circuit 520 may also be connected to each other by the inner vias IV, and a transversal cross-sectional area of each of the inner vias IV connecting the second outer layer circuit 620 and the second inner layer circuit 520 to each other may also be decreased toward one surface of the insulating material 100. For example, the vias 400 penetrating through the first insulating layer 210 and the second insulating layer 220 and all the inner vias IV formed in the insulating material 100 may also have shapes symmetrical (or opposite) to each other.

Each of the vias 400 and the inner vias IV may include an electroless copper plating layer and an electrolytic copper plating layer.

The solder resist may be stacked on the upper surface of the second insulating layer 220 or the other surface (a lower surface) (the other surface "c" of the second layer 112) of the insulating material 100 in order to protect the outer layer circuits. The solder resist may be formed of a photosensitive material. In addition, the solder resist may have a thermo-setting and/or a photo-curable property.

The solder resist may include a first solder resist 710 formed on the upper surface of the second insulating layer 220 to protect the first outer layer circuit 610 and a second solder resist 720 formed on the other surface (the lower surface) (the other surface "c" of the second layer 112) of the insulating material 100 to protect the second outer layer circuit 620.

The first solder resist 710 may include a second cavity C2. The second cavity C2 is connected to the first cavity C1 of the first insulating layer 210. When an electronic element is mounted on the printed circuit board, the electronic element is positioned in the first cavity C1 and the second cavity C2.

A width and an area of the second cavity C2 may be equal to or greater than those of the first cavity C1. As illustrated in FIG. 1, a width and an area of the first cavity C1 and a width and an area of the second cavity C2 may be the same as each other. In a case in which the width and the area of the first cavity C1 and the width and the area of the second cavity C2 are different from each other, the inner side surface of the first cavity C1 and an inner side surface of the second cavity C2 may be smoothly connected to each other without being bent on a boundary therebetween.

The first solder resist 710 may include first openings 711 exposing at least portions of the first outer layer circuit 610, and the second solder resist 720 may include second openings 721 exposing at least portions of the second outer layer circuit 620. A pitch of the first openings 711 may be different from a pitch of the second openings 721.

Conductive members 50 such as solder balls may be formed in the first openings 711 of the first solder resist 710. In addition, conductive members such as solder balls may also be formed in the second openings 721 of the second solder resist 720. The conductive members 50 formed in the first openings 711 may be bonded to a package board, and the conductive members formed in the second openings 721 may be bonded to a mainboard.

Figure 3:
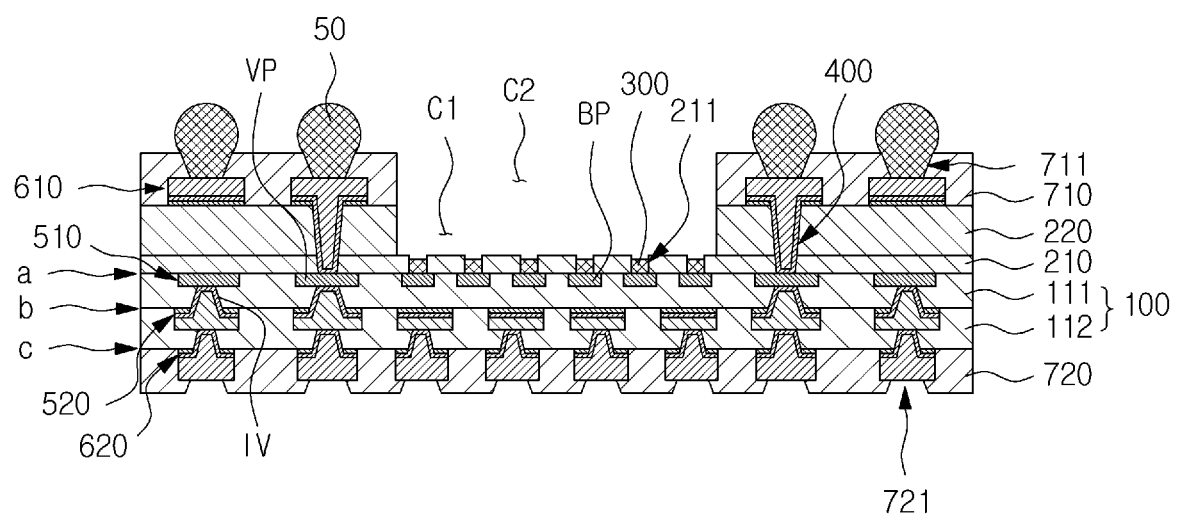
FIG. 3 is a view illustrating a printed circuit board according to an example.

FIG. 3 is a view illustrating a printed circuit board according to another example.

Referring to FIG. 3, the printed circuit board includes an insulating material 100, a first insulating layer 210, a second insulating layer 220, and bumps 300.

In the example of FIG. 3, a height of a bump 300 is smaller than that of an opening portion 211, unlike the printed circuit board described with reference to FIG. 1. An upper surface of the bump 300 is positioned on a level below an upper surface of the opening portion 211. The upper surface of the bump 300 may be upwardly convex. Also in this case, the highest point of the bump 300 may be positioned below the upper surface of the opening portion 211.

In a case in which a thickness of the electronic element mounted on the printed circuit board, that is, positioned in the first cavity C1 and the second cavity C2 is relatively great or in a case in which an electrode of the electronic element protrudes from one surface of the electronic element toward the bump 300, the height of the bump 300 is implemented to be smaller than that of the opening portion 211, such that it is possible to prevent the electronic element from excessively protruding upward of the first and second cavities C1 and C2.

The contents described with reference to FIGS. 1 and 2 may be similarly applied to other configurations.

FIGS. 4(a) to 4(k) are views illustrating a method of manufacturing a printed circuit board according to an example.

Referring to FIG. 4(a), the insulating material 100 including the first inner layer circuit 510, the second inner layer circuit 520, the second outer layer circuit 620, and the inner vias IV is formed using a carrier film CF. In detail, the insulating layer 100 may be formed by forming the first inner layer circuit 510 beneath the carrier film CF, stacking the first layer 111, forming the inner vias IV and the second inner layer circuit 520, stacking the second layer 112, forming the inner vias IV and the second outer layer circuit 620, and then removing the carrier film CF. Here, the first inner layer circuit 510 may be formed by a tenting method, and the second inner layer circuit 520 and the second outer layer circuit 620 may be formed by a method such as an SAP or an MSAP. Since the carrier film CF is used, the first inner layer circuit 510 may be embedded in one surface of the first layer 111.

Referring to FIG. 4(b), the first insulating layer 210 is stacked on one surface of the insulating material 100.

Referring to FIG. 4(c), a resist R is formed on the first insulating layer 210, and opening portions 211 penetrating through both of the resist R and the first insulating layer 210 are formed in the resist R and the first insulating layer 210. Here, the opening portions 211 are formed to correspond to the bump pads BP. The bumps 300 are formed in the opening portions 211. Here, when a height of the bump 300 is greater than a thickness of the first insulating layer 210, it may be the printed circuit board illustrated in FIG. 1, and when a height of the bump 300 is smaller than a thickness of the first insulating layer 210, it may be the printed circuit board illustrated in FIG. 3.

Referring to FIG. 4(d), the resist R is peeled off after the bumps 300 are formed.

Referring to FIG. 4(e), a barrier film BF is formed on the bumps 300. The barrier film BF is not formed over an entire surface of the first insulating layer 210, and is formed to correspond to a region in which the first cavity C1 is to be formed. In a case in which the number of bumps 300 is plural and the plurality of bumps 300 are arranged at a central portion of the insulating material 100 (a central portion of the first insulating layer 210), the barrier film BF may be formed at the central portion of the first insulating layer 210. The barrier film BF may be a dry film resist (DFR).

Referring to FIG. 4(f), the second insulating layer 220 is stacked on the first insulating layer 210. The second insulating layer 220 covers the barrier film BF. The second insulating layer 220 may cover an upper surface and side surfaces of the barrier film BF. A copper foil layer M may be formed on an outer surface of the second insulating layer 220 (a surface of the second insulating layer 220 that is not in contact with the first insulating layer 210).

Referring to FIG. 4(g), the vias 400 and the first outer layer circuit 610 are formed. The first outer layer circuit 610 may be formed by a method such as an SAP or an MASP. In this case, the first outer layer circuit 610 may be formed by sequentially stacking an electroless copper plating layer and an electrolytic copper plating layer on the copper foil layer M and then partially etching the copper foil layer M and the electroless copper plating layer. The vias 400 may be formed by forming an electroless copper plating layer and an electrolytic copper plating layer in via holes penetrating through both of the first insulating layer 210 and the second insulating layer 220.

An interface between the first insulating layer 210 and the second insulating layer 220 is not illustrated in FIG. 4(g) because the first insulating layer 210 and the second insulating layer 220 are integrated with each other, such that interface between the first insulating layer 210 and the second insulating layer 220 may disappear. However, this case does not exclude a case in which the interface may be formed between the first insulating layer 210 and the second insulating layer 220.

Figure 4:
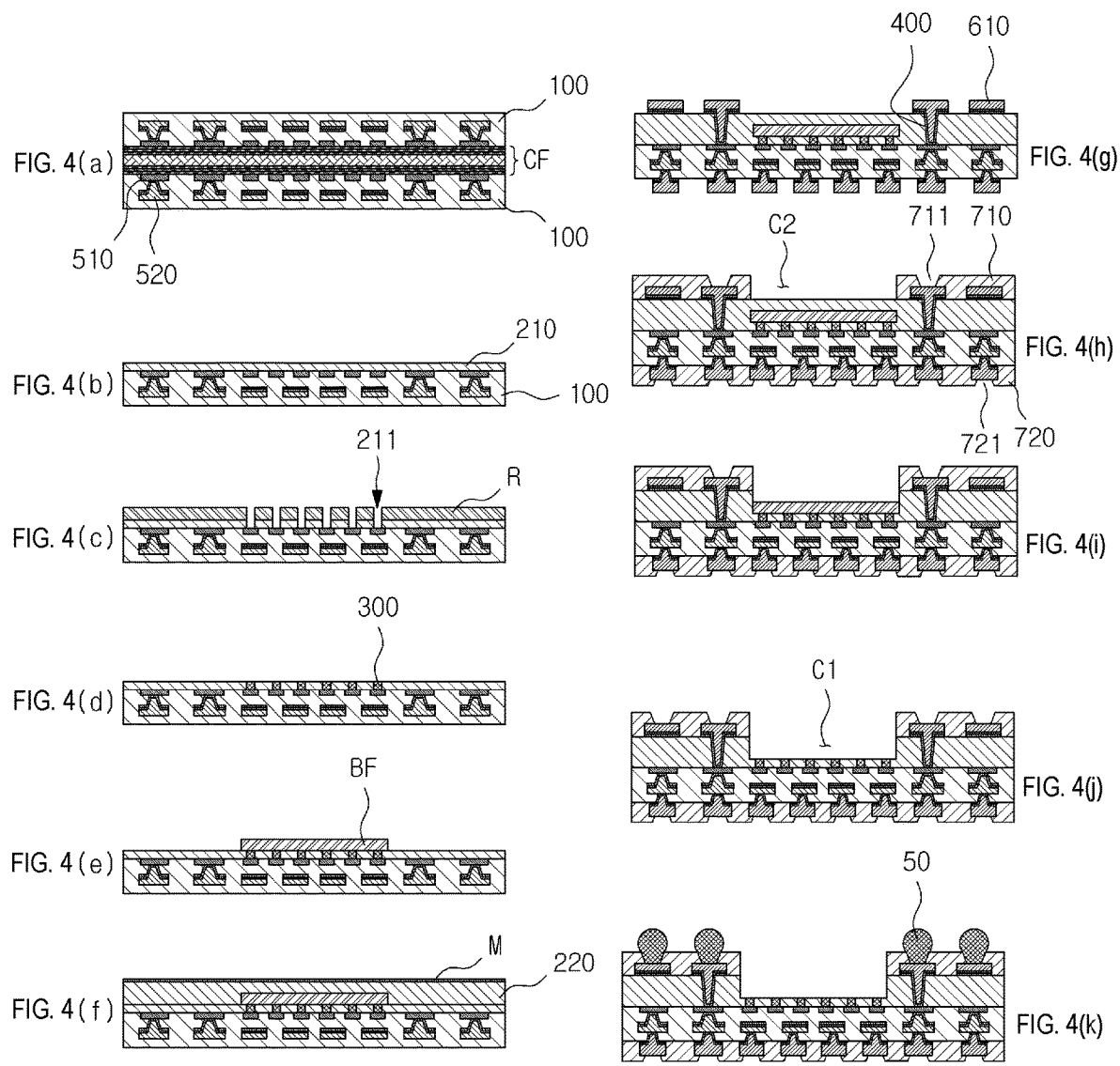
FIGS. 4(a), 4(b), 4(c), 4(d), 4(e), 4(f), 4(g), 4(h), 4(i), 4(j), and 4(k) are views illustrating a method of manufacturing a printed circuit board according to an example.

Referring to FIG. 4(*h*), the first solder resist 710 and the second solder resist 720 are formed, the first openings 711 and the second cavity C2 are formed in the first solder resist 710, and the second openings 721 are formed in the second solder resist 720. The second insulating layer 220 is exposed through the second cavity C2.

Referring to FIG. 4(*i*), the second insulating layer 220 present on the barrier film BF is removed. The barrier film BF may serve as a stopper in removing the second insulating layer 220. Therefore, the upper surface of the barrier film BF is exposed.

Referring to FIG. 4(*j*), the barrier film BF is removed, such that the first cavity C1 may be completed. In this case, the first cavity C1 and the second cavity C2 may have the same width and area.

Referring to FIG. 4(*k*), the conductive members 50 such as the solder balls are formed in the first openings 711. These conductive members 50 may be bonded to another printed circuit board.

Figure 5:
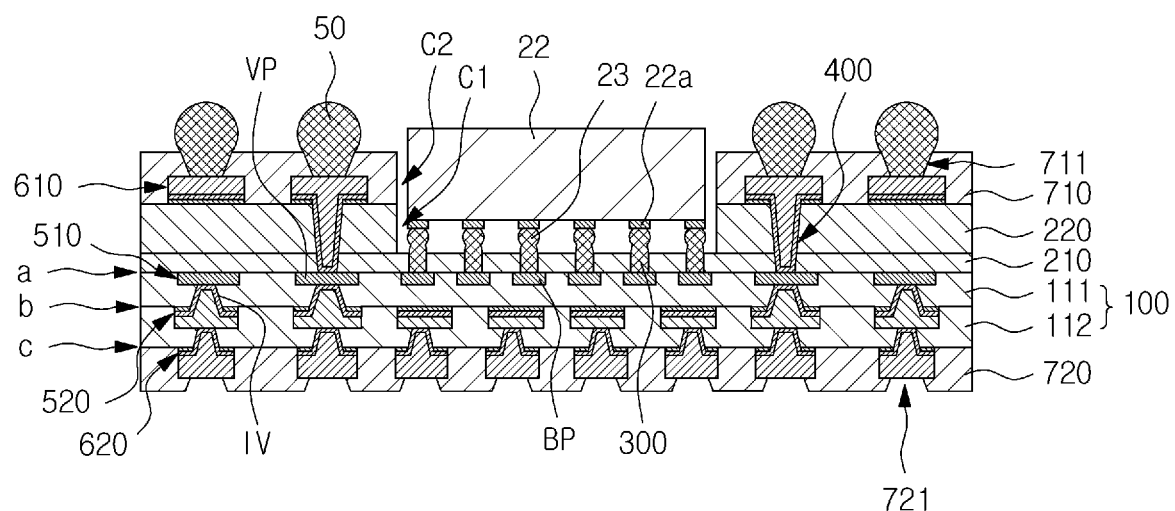
FIG. 5 is a view illustrating a package using a printed circuit board according to an example.
Figure 6:
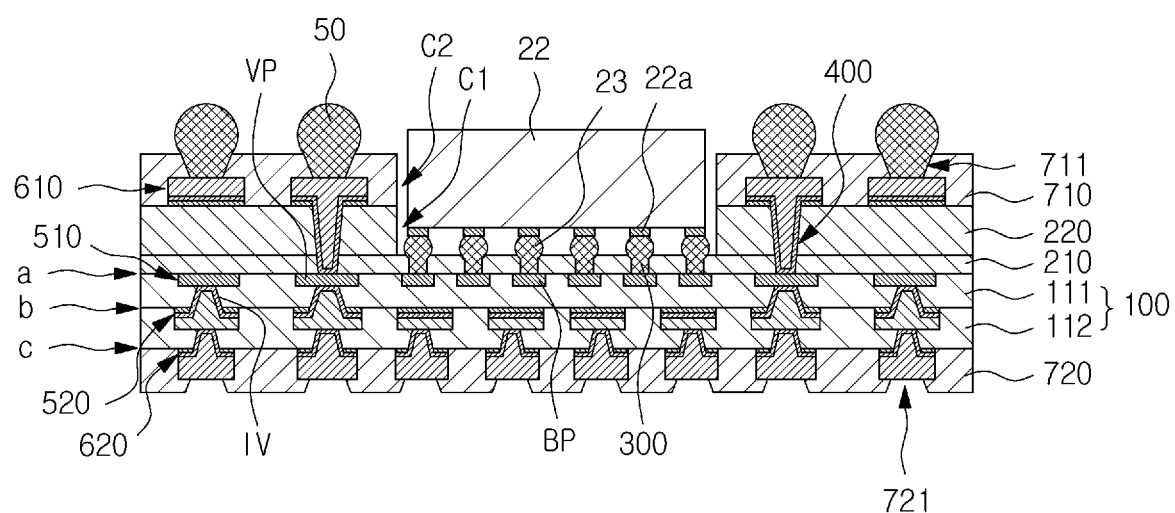
FIG. 6 is a view illustrating a package using a printed circuit board according to an example.

FIG. 5 is a view illustrating a package using a printed circuit board according to an example, and FIG. 6 is a view illustrating a package using a printed circuit board according to another example.

Referring to FIG. 5, a package is prepared by mounting an electronic element 22 on a printed circuit board, such as a printed circuit board similar to that illustrated in FIG. 1. The electronic element 22 may be positioned in the first cavity C1 and the second cavity C2, and electrodes 22*a* of the electronic element 22 and the bumps 300 may be bonded to each other by bonding members 23 such as solders. The bonding member 23 may be formed of the same material as that of the bump 300, and may be integrated with the bump 300 at the time of being bonded to the bump 300. A width of the bonding member 23 may be greater than that of the bump 300.

The electrodes 22*a* may protrude from one surface of the electronic element 22 toward the first insulating layer 210. When the electronic element 22 is mounted on the printed circuit board, gaps corresponding to heights of the electrode 22*a*, the bonding member 23, and an upper portion of the bump 300 may be generated between the electronic element 22 and the first insulating layer 210. The electronic element 22 may be fixed by forming a molding material between the first cavity C1 and the second cavity C2 or be fixed by forming an underfill between the gaps.

The electronic element 22 may be at least one of an active element, a passive element, and an integrated circuit.

Referring to FIG. 6, a package is prepared by mounting an electronic element 22 on a printed circuit board, such as a printed circuit board similar to that illustrated in FIG. 3. The electronic element 22 may be positioned in the first cavity C1 and the second cavity C2, and electrodes 22*a* of the electronic element 22 and the bumps 300 may be bonded to each other by bonding members 23 such as solders. The bonding member 23 may be formed of the same material as that of the bump 300, and may be introduced into the opening portion 211 at the time of being bonded to the bump 300 to be integrated with the bump 300. A width of the bonding member 23 may be greater than that of the bump 300.

The electrodes 22*a* may protrude from one surface of the electronic element 22 toward the first insulating layer 210. When the electronic element 22 is mounted on the printed circuit board, gaps corresponding to heights of the electrode 22*a* and the bonding member 23 may be generated between the electronic element 22 and the first insulating layer 210. The electronic element 22 may be fixed by forming a molding material between the first cavity C1 and the second cavity C2 or be fixed by forming an underfill between the gaps.

The electronic element 22 may be at least one of an active element, a passive element, and an integrated circuit.

Figure 7:
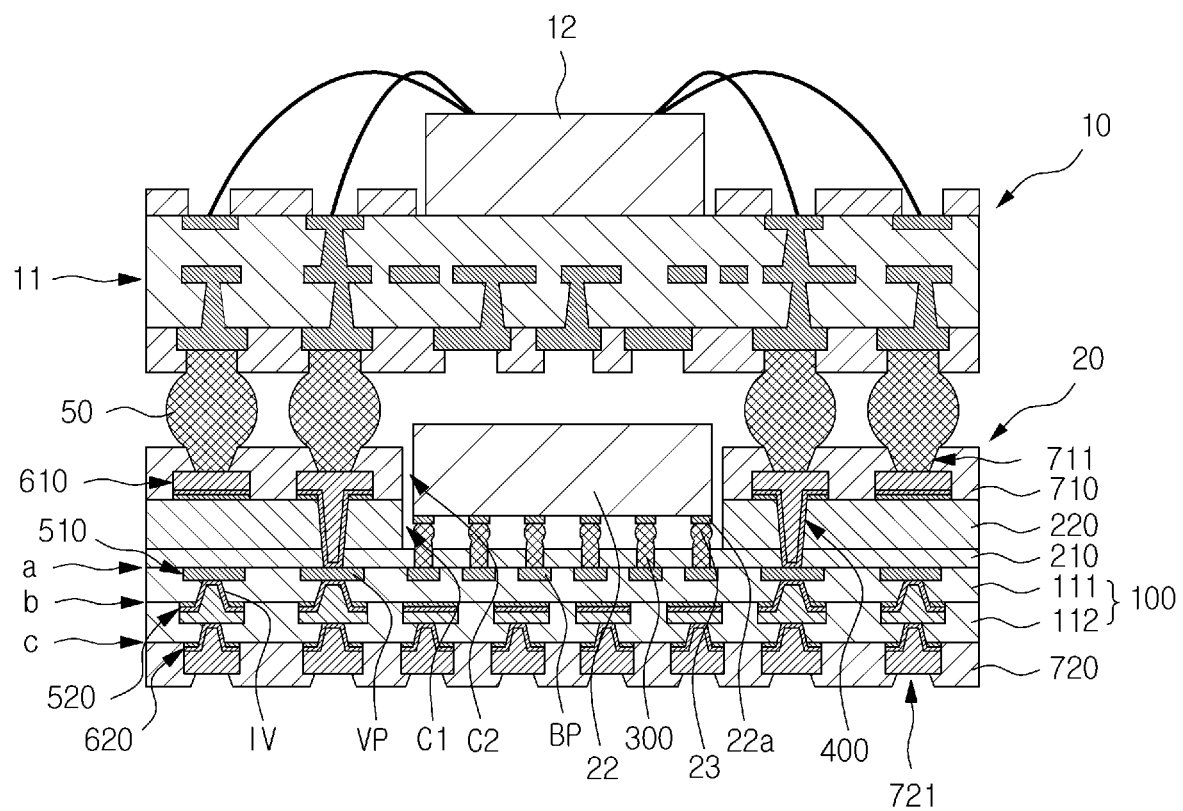
FIG. 7 is a view illustrating a package structure according to an example.
Figure 8:
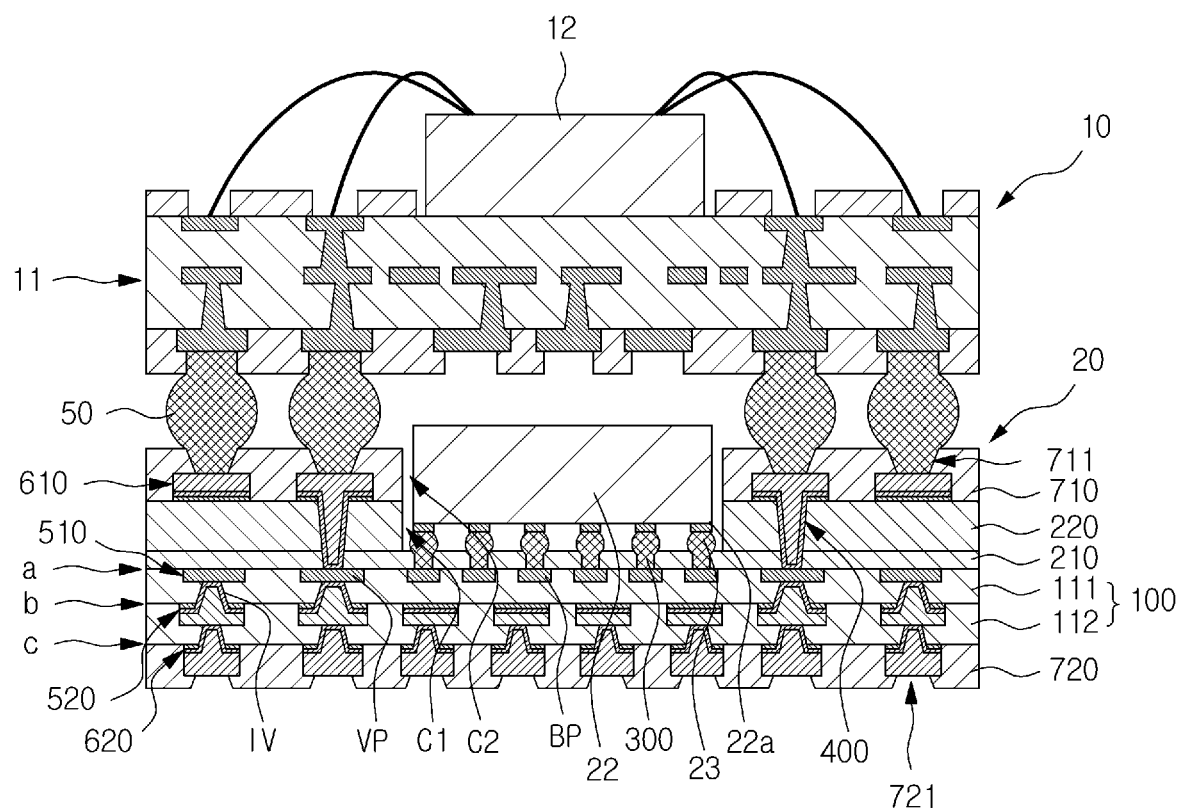
FIG. 8 is a view illustrating a package structure according to an example.

FIG. 7 is a view illustrating a package structure according to an example, and FIG. 8 is a view illustrating a package structure according to another example.

Referring to FIG. 7, the package structure includes an upper package 10 and a lower package 20. The upper package 10 includes a printed circuit board 11 on which an electronic element 12 is mounted. The printed circuit board 11 of the upper package 10 may not include a cavity. In this case, the electronic element 12 may be mounted on an upper surface of the printed circuit board 11. The electronic element 12 may be mounted in a wire bonding manner. However, a manner of mounting the electronic element 12 is not limited thereto, and may be a flip-chip mounting manner.

The package described with reference to FIG. 5 may be used as the lower package 20 in the example of FIG. 7.

The lower package 20 may include the printed circuit board on which the electronic element 22 is mounted, and the printed circuit board described with reference to FIG. 1 may be used as the printed circuit board in the example of FIG. 7.

The electronic element 22 may be positioned in the first cavity C1 and the second cavity C2, and electrodes 22*a* of the electronic element 22 and the bumps 300 may be bonded to each other by bonding members 23 such as solders. The bonding member 23 may be formed of the same material as that of the bump 300, and may be integrated with the bump 300 at the time of being bonded to the bump 300. A width of the bonding member 23 may be greater than that of the bump 300.

The electrodes 22*a* may protrude from one surface of the electronic element 22 toward the first insulating layer 210. When the electronic element 22 is mounted on the printed circuit board, gaps corresponding to heights of the electrode 22*a*, the bonding member 23, and an upper portion of the bump 300 may be generated between the electronic element 22 and the first insulating layer 210. The electronic element 22 may be fixed by forming a molding material between the first cavity C1 and the second cavity C2 or be fixed by forming an underfill between the gaps. The electronic element 12 mounted on the printed circuit board 11 in the upper package 10 may also be molded.

The upper package 10 and the lower package 20 may be bonded to each other by conductive members 50 such as solder balls. The conductive members 50 may be positioned on the vias 400, be formed in the first openings 711 of the first solder resist 710, and be bonded to regions of the first outer layer circuit 610 exposed through the first openings 711. In a case in which the vias 400 are positioned more adjacent to edges than the cavities C1 and C2 are, the conductive members 50 may also be positioned at edges of the lower package 20.

Referring to FIG. 8, the package structure includes an upper package 10 and a lower package 20. The upper package 10 includes a printed circuit board 11 on which an electronic element 12 is mounted. The printed circuit board 11 of the upper package 10 may not include a cavity. In this case, the electronic element 12 may be mounted on an upper surface of the printed circuit board 11. The electronic element 12 may be mounted in a wire bonding manner. However, a manner of mounting the electronic element 12 is not limited thereto, and may be a flip-chip mounting manner.

The package described with reference to FIG. 6 may be used as the lower package 20 in the example of FIG. 8.

The lower package 20 may include the printed circuit board on which the electronic element 22 is mounted, and the printed circuit board described with reference to FIG. 3 may be used as the printed circuit board in the example of FIG. 8.

The electronic element 22 may be positioned in the first cavity C1 and the second cavity C2, and electrodes 22a of the electronic element 22 and the bumps 300 may be bonded to each other by bonding members 23 such as solders. The bonding member 23 may be formed of the same material as that of the bump 300, and may be introduced into the opening portion 211 at the time of being bonded to the bump 300 to be integrated with the bump 300. A width of the bonding member 23 may be greater than that of the bump 300.

The electrodes 22a may protrude from one surface of the electronic element 22 toward the first insulating layer 210. When the electronic element 22 is mounted on the printed circuit board, gaps corresponding to heights of the electrode 22a and the bonding member 23 may be generated between the electronic element 22 and the first insulating layer 210. The electronic element 22 may be fixed by forming a molding material between the first cavity C1 and the second cavity C2 or be fixed by forming an underfill between the gaps. The electronic element 12 mounted on the printed circuit board 11 in the upper package 10 may also be molded.

The upper package 10 and the lower package 20 may be bonded to each other by conductive members 50 such as solder balls. The conductive members 50 may be positioned on the vias 400, be formed in the first openings 711 of the first solder resist 710, and be bonded to regions of the first outer layer circuit 610 exposed through the first openings 711. In a case in which the vias 400 are positioned more adjacent to edges than the cavities C1 and C2 are, the conductive members 50 may also be positioned at edges of the lower package 20.

In the package structures of FIGS. 7 and 8, the cavities C1 and C2 are formed in the printed circuit board of the lower package 20 and the electronic element 22 is mounted in the cavities C1 and C2. Therefore, a distance between the lower package 20 and the upper package 10 need not be equal to or greater than a thickness of the electronic element 22, and even in a case in which a pitch of the conductive members 50 bonding two packages to each other is small, the two packages may implement a package-on-package (POP)-type package structure without using a separate interposer.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
   an insulating material comprising a plurality of bump pads embedded in a first surface thereof;
   a first insulating layer stacked on the first surface of the insulating material and comprising a plurality of opening portions corresponding to and exposing the plurality of bump pads; and
   a second insulating layer stacked on the first insulating layer and comprising a first cavity exposing the plurality of opening portions.

2. The printed circuit board of claim 1, wherein a thickness of the first insulating layer is less than a thickness of the second insulating layer.

3. The printed circuit board of claim 1, further comprising:
   a first outer layer circuit disposed on the second insulating layer and protruding outwardly; and
   a first solder resist covering the first outer layer circuit,
   wherein the first solder resist comprises a second cavity connected to the first cavity.

4. The printed circuit board of claim 3, further comprising:
   a second outer layer circuit disposed on a second surface of the insulating material opposite the first surface and protruding outwardly; and
   a second solder resist covering the second outer layer circuit.

5. The printed circuit board of claim 3, further comprising:
   an opening disposed in the first solder resist and exposing a portion of the first outer layer circuit; and
   a conductive member disposed in the opening.

6. The printed circuit board of claim 1, further comprising:
   a via pad embedded in the first surface of the insulating material; and
   a via penetrating through the first insulating layer and the second insulating layer and connected to the via pad.

7. The printed circuit board of claim 6, further comprising an inner via disposed in the insulating material and connected to the via pad,
   wherein a transversal cross-sectional area of the via is decreased toward the via pad, and a transversal cross-sectional area of the inner via is decreased toward the via pad.

8. The printed circuit board of claim 1, further comprising a plurality of bumps disposed on the plurality of bump pads in the plurality of the opening portions, respectively.

9. The printed circuit board of claim 8, wherein heights of the plurality of bumps with respect to the first surface of the insulating material are greater than heights of the plurality of opening portions with respect to the first surface of the insulating material.

10. The printed circuit board of claim 8, wherein heights of the plurality of bumps with respect to the first surface of the insulating material are less than heights of the plurality of opening portions with respect to the first surface of the insulating material.

11. A package structure comprising:
    an upper package; and
    a lower package coupled to the upper package,
    wherein the lower package comprises a printed circuit board on which an electronic element is mounted, the printed circuit board comprising:
an insulating material comprising a plurality of bump pads embedded in a first surface thereof;
a first insulating layer stacked on the first surface of the insulating material and comprising a plurality of opening portions corresponding to and exposing the plurality of bump pads; and
a second insulating layer stacked on the first insulating layer and comprising a first cavity exposing the plurality of opening portions, and
the electronic element is disposed in the first cavity and bonded to the bump.

12. The package structure of claim 11, wherein a thickness of the first insulating layer is less than a thickness of the second insulating layer.

13. The package structure of claim 11, wherein the printed circuit board further includes:
a first outer layer circuit disposed on the second insulating layer and protruding outwardly; and
a first solder resist covering the first outer layer circuit, wherein the first solder resist comprises a second cavity connected to the first cavity.

14. The package structure of claim 13, wherein the printed circuit board further includes:
a second outer layer circuit disposed on a second surface of the insulating material opposite the first surface and protruding outwardly; and
a second solder resist covering the second outer layer circuit.

15. The package structure of claim 13, wherein the printed circuit board further comprises:
an opening disposed in the first solder resist and exposing a portion of the first outer layer circuit; and
a conductive member disposed in the opening and electrically connecting the upper package to the lower package.

16. The package structure of claim 11, wherein the printed circuit board further comprises:
a via pad embedded in the first surface of the insulating material; and
a via penetrating through the first insulating layer and the second insulating layer and connected to the via pad.

17. The package structure of claim 16, wherein the printed circuit board further comprises an inner via disposed in the insulating material and connected to the via pad,
wherein a transversal cross-sectional area of the via is decreased toward the via pad, and a transversal cross-sectional area of the inner via is decreased toward the via pad.

18. The package structure of claim 11, further comprising a plurality of bumps disposed on the plurality of bump pads in the plurality of the opening portions, respectively.

19. The package structure of claim 18, wherein heights of the plurality of bumps with respect to the first surface of the insulating material are greater than heights of the plurality of opening portions with respect to the first surface of the insulating material.

20. The package structure of claim 18, wherein heights of the plurality of bumps with respect to the first surface of the insulating material are less than heights of the plurality of opening portions with respect to the first surface of the insulating material.

21. A printed circuit board comprising:
an insulating material comprising a bump pad embedded in a first surface thereof;
a first insulating layer stacked on the first surface of the insulating material and comprising an opening portion exposing the bump pad; and
a second insulating layer stacked on the first insulating layer and comprising a first cavity exposing the opening portion,
wherein a surface of the bump pad exposed by the opening portion is coplanar with the first surface of the insulating material.

* * * * *